United States Patent [19]
Fey et al.

[11] Patent Number: 5,910,341
[45] Date of Patent: *Jun. 8, 1999

[54] METHOD OF CONTROLLING THE SPREAD OF AN ADHESIVE ON A CIRCUITIZED ORGANIC SUBSTRATE

[75] Inventors: Edmond Otto Fey, Vestal; Kenneth Stanley Lyjak, Apalachin; Donna Jean Trevitt, Vestal, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/742,139

[22] Filed: Oct. 31, 1996

[51] Int. Cl.⁶ .................................................. C23C 14/02
[52] U.S. Cl. .................. 427/534; 427/96; 427/207.1; 427/208.6; 427/265; 427/412.1; 427/536; 427/537; 427/539; 427/569
[58] Field of Search .................................. 427/96, 208.6, 427/207.1, 265, 412.1, 569, 536, 539, 537, 534

[56] References Cited

U.S. PATENT DOCUMENTS

| | | | |
|---|---|---|---|
| 4,579,623 | 4/1986 | Suzuki et al. | 156/626 |
| 4,615,763 | 10/1986 | Gelorme et al. | 156/643 |
| 4,681,654 | 7/1987 | Clementi et al. | 216/18 |
| 4,908,094 | 3/1990 | Jones et al. | 156/633 |
| 5,039,569 | 8/1991 | Jones et al. | 428/141 |
| 5,143,748 | 9/1992 | Ishikawa et el. | 427/40 |
| 5,208,067 | 5/1993 | Jones et al. | 427/96 |
| 5,283,119 | 2/1994 | Shuttleworth et al. | 428/375 |
| 5,487,810 | 1/1996 | Thurm et al. | 216/67 |

*Primary Examiner*—Bernard Pianalto
*Attorney, Agent, or Firm*—Calfee, Halter & Griswold, LLP

[57] ABSTRACT

A method for preparing a circuitized organic substrate for the subsequent deposition of an adhesive thereon is provided. The method comprises exposing the circuitized substrate to a plasma formed from a gas mixture comprising a fluorine-containing entity. Preferably, the gas mixture used to form the plasma also comprises oxygen. It has been determined that treatment of the circuitized substrate with a plasma formed from a gas mixture comprising at least 20% by volume of the fluorine-containing entity and, preferably, up to about 80% by volume of oxygen reduces the spread of an adhesive deposited on the surface of the organic substrate. It has also been determined that such treatment does not adversely affect the subsequent bonding of wires to the wire bond sites that are present on the surface of the substrate.

19 Claims, No Drawings

METHOD OF CONTROLLING THE SPREAD OF AN ADHESIVE ON A CIRCUITIZED ORGANIC SUBSTRATE

FIELD OF THE INVENTION

This invention relates generally to a method of controlling the spread of an adhesive on a circuitized organic substrate. More particularly, this invention relates to a method of treating the organic substrate so as to reduce the spread of an adhesive that is subsequently deposited on the circuitized surface thereof

BACKGROUND OF THE INVENTION

Typically semiconductor chips are attached to organic circuitized substrates by means of a polymeric, organic, adhesive. The adhesive, which initially is in the form of a viscous liquid, is distributed onto preselected regions on the circuitized surface. Thereafter, the perimeter of the semiconductor chip is aligned with and placed on the adhesive. The entire structure, including substrate, adhesive and chip, is then baked to cure the adhesive to thereby strengthen the attachment of the semiconductor chip to the underlying substrate. In some cases, the semiconductor chip is then electrically connected to the electric circuitry of the carrier by wire bonding terminals on the chip to wire bond sites that form part of the circuitry on the surface of the substrate.

The adhesives that are currently used to attach semiconductor chips to circuitized organic substrates include for example, epoxy-based adhesives, acrylic-based adhesives, silicones, and polyimides. Although such adhesives are fairly viscous, they still have a tendency to spread over the surface of the underlying substrate, which is formed from an organic resinous material. Such adhesives also have a tendency to spread over any portions of a soldermask which lie in the vicinity of the deposited adhesive. The expanding adhesive may also come into contact with and cover portions of the wire bond sites that are on the surface, thereby interfering with attachment of the bonding wires to the wire bond sites. The problem of adhesive spread is even more pronounced when the circuitized substrate is treated with a plasma containing oxygen, argon or mixtures thereof prior to application of the adhesive to the circuitized substrate. Such plasma treatment is often used to clean the wire bond sites and to roughen the substrate surface.

Accordingly, a method of controlling the spread of an adhesive over the surface of a circuitized organic substrate would be highly desirable. A method which reduces the spread of the adhesive on the surface of the organic substrate and which does not interfere with the bonding of the bonding wires to the wire bond sites is especially desirable.

SUMMARY OF THE INVENTION

In accordance with the present invention, a method for preparing a circuitized organic substrate for the subsequent deposition of an adhesive thereon is provided. This method comprises exposing the circuitized substrate to a plasma formed from a gas mixture comprising a fluorine-containing entity. Preferably, the gas mixture used to form the plasma also comprises oxygen.

In accordance with the present invention, it has been determined that treatment of the circuitized substrate with a plasma formed from a gas mixture comprising at least 20% by volume of the fluorine-containing entity and, preferably, up to about 80% by volume of oxygen reduces the spread of an adhesive deposited on the surface of the organic substrate. Such treatment also reduces the spread of the adhesive on the metallic components present on the surface of the substrate. It has also been determined that such treatment does not adversely affect the subsequent bonding of wires to the wire bond sites that are on the surface of the substrate.

DETAILED DESCRIPTION

In accordance with the present invention, an organic substrate having wire bond sites plated on a circuitized surface thereof is treated with a fluorine-containing plasma to reduce the spread of an adhesive which is subsequently deposited onto preselected sites of the substrate circuitized surface. Such treatment prevents the adhesive from spreading over the substrate surface and from contacting the wire bond sites which are present on the surface of the substrate. In the preferred embodiment, the substrate is a semiconductor chip carrier.

Any organic resinous material which typically is used to form the underlying substrate of a semiconductor chip carrier can be subjected to the plasma treatment of the present invention. Examples of resinous materials which are used to form such underlying substrates include for example epoxy-based resins, epoxy resins reinforced with woven fiberglass, polyimides and benzotriazol resins.

Any organic material which is used to form a soldermask can also be subjected to such plasma treatment. Typically such soldermasks are made from epoxy-based resins, acrylate-based resins, and combinations of epoxy-based and acrylate-based resins. One example of the material which is frequently used to form a solder mask is the epoxy/acrylate-based material Vacrel available from E.I. duPont de Nemours Corporation, Wilmington, Del.

Furthermore, the inorganic materials that are used to form the circuit lines, the ground pads, and the wire bond sites which are on the surface of the circuitized substrate can also be subjected to the plasma treatment of the present invention. Such inorganic materials include, for example, copper from which the circuitry is formed and gold, which along with nickel is plated over the copper circuitry to provide a wire bondable-surface and to provide protection against corrosion.

In accordance with the present invention, the circuitized substrate is placed in a plasma chamber and thereafter a gas comprising a fluorine-containing entity is introduced into the chamber. Preferably, oxygen is also introduced into the plasma chamber. The resulting gas mixture, comprising the fluorine-containing entity and, preferably, oxygen is then electrically activated to form a plasma. As used herein, a plasma is intended to encompass all gas mixtures in an excited state. Suitable fluorine-containing entities that are present in the gas mixture include, for example, $CF_4$, $C_2F_6$, and $SF_6$. Preferably, the fluorine-containing entity comprises at least 20% by volume of the final gas mixture that is introduced into the plasma chamber. More preferably, the fluorine entity comprises at least 50% by volume of the gas mixture, most preferably from about 65% to about 85% by volume of the gas mixture. Preferably, substantially all of the balance of the gas mixture is oxygen. Although not necessary, the gas mixture may also contain an inert gas such as, for example, argon or helium and minor components of nitrogen and water vapor. Preferably, the gas mixture comprises less than 40% of the inert gas and less than 5% of the minor components.

The plasma is activated by an electrical field using frequencies of up to 2.5 GHz, wherein the preferred frequency range is from about 30 KHz to about 14 MHz.

Preferably, the gas pressure of the plasma is from about 70 millitorr to about 400 millitorr, more preferably from about 100 to about 180 millitorr. Preferably, the substrate is positioned in the chamber such that the circuitized surface faces the powered electrode of the plasma chamber. The process time for treatment with the plasma is preferably from about two minutes to about ten minutes. The other operating conditions which are suitable for minimizing the spread of adhesives on the substrate, such as for example gas flow rate, are variable and dependent on the apparatus used to perform the treatment.

Following treatment with the fluorine-containing plasma and other processing steps, an adhesive is applied to preselected sites on the substrate surface. In those instances where the circuitized organic substrate is being used as a semiconductor chip carrier, a semiconductor chip is then bonded to the surface via the adhesive.

In an alternative embodiment, the circuitized substrate is pre-treated with a plasma containing oxygen at 90 to 400 millitorr pressure for 1 to 10 minutes to remove any organic contaminants which may have accumulated on the surfaces of the gold-plated circuitry. Thereafter, the fluorine-containing gas mixture is introduced into the plasma chamber.

It has been found that treatment of a circuitized organic substrate in accordance with the present invention makes the surface of the organic substrate less wettable to both water and to the materials contained in a typical uncured adhesive material, such as, for example, a liquid epoxy. It has also been found that treatment of the circuitized substrate in accordance with the present invention results in the formation of a thin film of fluorocarbon on the metallic components of the circuitized substrate. As a result, the metallic components which are on the surface of the circuitized substrate are also less wettable.

It has also been found that treatment of a circuitized substrate with a fluorine-containing plasma in accordance with the present invention does not diminish the strength of the bonds formed between the wire bond sites on the surface of the substrate and the wires which are subsequently used to connect the wire bond sites to the semiconductor chip nor diminishes the integrity of this electrical contact.

It has also been found that treatment of a circuitized substrate having gold-plated areas in accordance with the present invention causes, in some instances, a discoloration of the gold. Such discoloration tends to occur at somewhat greater frequency at high loads and may be associated with high etch rate zones in the reactor chamber. Thus, if necessary, the circuitized substrate is further exposed to a plasma comprising an inert gas, preferably argon, after the treatment with the fluorine-containing plasma to remove the discoloration. Preferably, the gas pressure of the plasma comprising the inert gas is from about 100–200 millitorr and the process time is from about two to about four minutes. Then the circuitized substrate is again treated with a fluorine-containing plasma to restore the non-wettability of the components on the circuitized surface. Although the conditions employed during this second treatment with a fluorine-containing plasma may be the same as described above, it is preferred that the substrate be placed in the plasma chamber such that the circuitized surface faces the ground electrode rather than the powered electrode.

The following non-limiting examples are presented to further illustrate the present invention.

EXAMPLES

Example 1

Test panels comprising a fiberglass-filled epoxy-based substrate having an epoxy/acrylate-based soldermask covering portions thereof and gold-plated circuitry in the form of ground pads and wire bond sites plated on the surface thereof were loaded into a plasma reactor obtained from Advanced Plasma Systems, Saint Petersburg, Fla. and sold as Model 2400. The APS2400 is a 35 kHz system and is configured to hold six panels. The organic substrate was an epoxy sold under the brand name Driclad by IBM Corporation. (Driclad is a trademark of IBM Corporation.) The soldermask was Vacrel 8130 available from DuPont. All panels were pre-treated for 16 minutes at 140 millitorr with a plasma containing argon and oxygen at a ratio of 3 to 2 remove organic contaminants from the gold-plated circuitry.

Following exposure to the pre-treatment plasma, the panels were removed and one test panel was loaded into the plasma chamber such that the circuitized surface faced the powered electrode, while the opposing surface faced the ground electrode. Control panels comprising an epoxy-based organic substrate but lacking the gold-plated circuitry were loaded into the remaining 5 cells. A gas mixture of 75% $CF_4$ and 25% oxygen was introduced into the chamber to a pressure of 140 millitorr. A plasma was set up by applying an electric power of 3 KW for four minutes.

Following treatment with the fluorine-containing plasma, a drop of the liquid epoxy ERL 4299 from Union Carbide was deposited on to twenty eight different spaced-apart sites across the circuitized surface of the test panel and the static contact angle of the epoxy liquid droplet measured using a goniometer. The contact angles ranged from about 62° to 90°, with contact angles above 40° indicating a significant improvement in the non-wettability of the organic substrate with respect to the epoxy liquid.

The contact angles of the epoxy liquid ERL 2499 on different sites of the gold-plated ground pads were also measured. These measurements showed that treatment with the fluorine-containing plasma under the present conditions increased the contact angle of the epoxy liquid on the gold-plated components of the circuitized substrate from a range of about 25° to 30° to a range of about 45° to 60°.

A water droplet was placed on the surface of the organic substrate and on the surface of the soldermask and the contact angles between the water droplet on these respective surfaces visually estimated. This study indicated that the water contact angle on the substrate surface increased from less than 20 degrees prior to treatment with the fluorine-containing plasma to greater than 100 degrees following treatment with the fluorine-containing plasma. Treatment with the fluorine-containing plasma increased the water contact angle on the surface of the soldermask from about 20 to 35 degrees to about 45 to 60 degrees. Thus, the present treatment also reduced the wettability of the soldermask but to a lesser extent.

The ability of an adhesive to adhere to the surface of the treated panel was assessed using a fracture toughness test. In brief, a cantilever beam of 8212 laminate was bonded to the circuitized surface of the substrate with Kapton tape to create a crack front. The bonded laminate was then pulled apart at a constant rate until the bonded area failed. The strain energy release rate was calculated and the failure mode determined. Cohesive failure occurs when the test beam tears, while adhesive failure occurs when the bonded laminate comes apart at or near the interface between the beam and substrate surface. This study showed that the present treatment did not significantly alter the strain energy release rate. In addition, the failure mode of the treated panel and laminate remained predominantly cohesive.

ESCA analysis on the gold plated components of the panels indicated that a thin film of fluorocarbon had been deposited on the metallized components of the panel during treatment with the $CF_4/O_2$ plasma. Auger spectroscopy indicated that the thickness of the deposit was in the range of 50 angstroms or less. The effect of this deposit on the bonding of wires to the gold-plated wire bond sites was determined by the wire bond pull test, which indicated that the presence of the deposit did not interfere with the bonding of wires to the gold-plated wire bond sites.

Example 2

Test panels comprising the same components as described in example 1 and pre-treated as described in example 1 were subjected to plasma treatment with a gas mixture comprising 75% $CF_4$ and 25% $O_2$ as described in Example 1 except that the gas pressure was reduced to 100 millitorr.

The contact angles between a drop of the epoxy liquid ERL 4299 and the plasma-treated organic substrate and gold-plated components were determined as described above in example 1. The contact angles of the epoxy liquid with the organic substrate ranged from 34° to about 84°. The effect of treatment under these conditions on the adhesion of the panel to an 8212 laminate was determined as described above in example 1 with substantially similar results. The plasma treatment conditions and the approximated contact angle of a water droplet with the plasma-treated organic substrate are shown in Table 1.

Example 3

A panel comprising the same components as described in example 1 and pre-treated as described in example 1 was then subjected to a plasma treatment with a gas mixture of 60% $CF_4$ and 40% oxygen. The plasma treatment conditions and the approximated contact angle of a water droplet with the plasma-treated organic substrate are shown in Table 1.

Example 4

A panel comprising the same components as described in example 1 and pre-treated as described in example 1 was then subjected to a plasma treatment with a gas mixture of 50% $CF_4$ and 50% oxygen. The plasma treatment conditions and the approximated contact angle of a water droplet with the plasma-treated organic substrate are shown in Table 1.

Example 5

A panel comprising the same components as described in example 1 and pre-treated as described in example 1 was then subjected to plasma treatment with a gas mixture of 40% $CF_4$ and 60% oxygen. The plasma treatment conditions and the approximated contact angle of a water droplet with the plasma-treated organic substrate are shown in Table 1.

TABLE 1

| % (vol) $CF_4$ in Feed Gas | Time (min) | Gas Pressure (MT) | Flow l/min | KW | Test Load (sq.in.) | Total Load (sq.in.) | Approx. Contact Angle (°) |
|---|---|---|---|---|---|---|---|
| 75 | 4 | 140 | 1.4 | 3 | 930 | 5800 | >100 |
| 75 | 4 | 107 | 1.8 | 3 | 930 | 5800 | >100 |
| 60 | 4 | 140 | 1.5 | 3 | 930 | 1850 | >100 |
| 50 | 4 | 132 | 2.4 | 3 | 230 | 2100 | >100 |
| 40 | 4.5 | 132 | 2.4 | 3 | 230 | 2100 | 90 |

Test Load = Total surface area of test panels.
Total Load = Total surface area of test panels and control panels.

As shown in Table 1, treatment of circuitized epoxy-based substrates with a plasma comprising from about 40% to about 75% $CF_4$ and from about 60% to about 25% oxygen significantly decreased the wettability of the substrate surface that was oriented to face the powered electrode.

Example 6

Panels comprising the same components as described in example 1 and pre-treated as described in example 1 were subjected to a two stage plasma treatment in which the circuitized test panel was first exposed to an oxygen plasma and then to a plasma formed from a gas mixture of 65% $CF_4$ and 35% oxygen. The plasma treatment conditions and the approximated contact angle of a water droplet with the plasma-treated organic substrate are shown in Table 2.

TABLE 2

| Stage | Feed Gas | Time (min) | Gas Pressure (MT) | Flow l/min | KW | Test Load (sq.in.) | Total Load (sq.in.) | Approx. Contact Angle (°) |
|---|---|---|---|---|---|---|---|---|
| 1 | $O_2$ | 3 | 123 | 2.5 | 3 | 930 | 5800 | — |
| 2 | 65% $CF_4$ | 3.1 | 140 | 1.5 | 3 | 930 | 5800 | >100 |
| 1 | $O_2$ | 2 | 127 | 2.4 | 3 | 930 | 1850 | — |
| 2 | 65% $CF_4$ | 4 | 140 | 2.4 | 3 | 930 | 1850 | >100 |

Test Load = Total surface area of test panels.
Total Load = Total surface area of test panels and control panels.

As shown in Table 2, treatment of epoxy-based substrates first with a plasma formed from oxygen and then with a plasma comprising 65% $CF_4$ and 35% oxygen also decreased the wettability of the substrate surface.

Example 7

A panel comprising a glass-reinforced polyimide substrate having gold-plated circuitry in the form of ground pads and wire bond sites on one surface thereof was loaded into one of the cells of the plasma reactor model 2400 obtained from Advanced Plasma Systems. The opposite side of the test panel was covered with Vacrel 8130. The panel was pre-treated for 12 minutes at 110 millitorr with a plasma containing argon and oxygen at a ratio of 3 to 2 to remove organic contaminants from the gold-plated circuitry.

Following evacuation of the pre-treatment plasma, a gas mixture of 65% $CF_4$ and 35% oxygen was introduced into the chamber at a pressure of 140 millitorr. A plasma was set up by applying an electric power of 3 KW for four minutes.

Following this treatment and removal of the panel from the plasma reactor, a water droplet was placed on the surface of the circuitized organic substrate and the contact angles between the water droplet and the substrate surface visually estimated. This study indicated that the water contact angle on the substrate surface increased from less than 20 degrees prior to treatment with the fluorine-containing plasma to greater than 100 degrees following treatment with the fluorine-containing plasma.

Example 8

Test panels comprising the same components as described in example 7 and pre-treated as described in example 7 were subjected to a plasma treatment with a gas mixture of 65% $CF_4$ and 35% oxygen except that the number of test panels loaded into the plasma chamber was increased to six. The water contact angles with the surface of the plasma treated organic substrate was visually estimated as described above. The plasma treatment conditions, load conditions, and the approximated contact angle of a water droplet with the plasma-treated organic substrate are shown in Table 3.

Example 9

Test panels comprising the same components as described in example 7 and pre-treated as described in example 7 were subjected to a plasma treatment with a gas mixture of 75% $CF_4$ and 25% oxygen. In addition, the number of test panels loaded into the plasma chamber was increased to twelve. In this example, one-half of the panels were oriented such that the circuitized surface faced the ground electrode. The water contact angles with the surface of the plasma treated organic substrate was visually estimated as described above. The water contact angles on the circuitized surfaces facing the ground electrode was highly variable and unacceptably low in some regions of the panels. The plasma treatment conditions, load conditions, and the approximated contact angle of a water droplet with the plasma-treated organic substrate are shown in Table 3.

TABLE 3

| % (vol) $CF_4$ in Feed Gas | Time (min) | Gas Pressure (MT) | Flow l/min | KW | Test Load (sq.in.) | Total Load (sq.in.) | Approx. Contact Angle (°) |
|---|---|---|---|---|---|---|---|
| 65 | 4 | 140 | 2.2 | 3 | 960 | 960 | ~100° |
| 65 | 4 | 140 | 2.2 | 3 | 960 | 5800 | 90°–120° |
| 75 | 4.5 | 145 | 2.2 | 3 | 11,600 | 11,600 | 30°–120° |

Test Load = Total surface area of test panels.
Total Load = Total surface area of test panels and control panels.

As shown in Table 3, treatment of a circuitized organic substrate with a plasma comprising from about 65% $CF_4$ and 35% oxygen to about 75% $CF_4$ and 25% oxygen increased the water contact angle on the surface of the substrate from less than 20 degrees to approximately 90 degrees or greater. These results also indicated that increasing the load in the plasma reactor lessened the effect of the plasma treatment in some areas of the substrate surface.

Example 10

A panel comprising a glass-reinforced epoxy-based substrate having a solder mask covering portions of one surface thereof and gold-plated circuitry in the form of ground pads and wire bond sites on the same surface carrying the solder mask was loaded into one of the cells of the APS2400 plasma reactor. The organic substrate was comprised of the epoxy resin Driclad. Five control panels covered with Vacrel 8130 but lacking the gold-plated circuitry were loaded into the remaining five cells. All panels were pre-treated for 3 minutes at 130 millitorr with a plasma containing argon and oxygen at a ratio of 3 to 2 to remove organic contaminants from the gold-plated circuitry.

Following evacuation of the pre-treatment plasma, a gas mixture of 50% $SF_6$ and 50% oxygen was introduced into the chamber at a pressure of 120 millitorr. A plasma was set up by applying an electric power of 3 KW for six minutes.

The effect of the plasma treatment on the wettability of the surface substrate was determined by placing a water droplet on the substrate surface and visually estimating the water contact angle. This study indicated that treatment of the epoxy-based surface under these conditions increased the water contact angle from about 30 degrees greater than 100 degrees.

Example 12

Panels comprising circuitized epoxy-based substrates and exhibiting discoloration of the gold-plated ground pads following treatment with a plasma comprising approximately 75% by volume $CF_4$ and approximately 25% by volume oxygen at a gas pressure of 140 millitorr were subsequently treated with an argon plasma at 130 millitorr for 2.5 minutes to remove the discoloration. The panels were then re-oriented in the APS2400 plasma reactor such that the surface carrying the gold-plated circuitry faced the ground electrode. A gas mixture comprising 60% $CF_4$ and 40% oxygen was introduced into the chamber to a pressure of 140 millitorr. A plasma was set up by applying an electric power of 3 KW for about 3 to about 4 minutes.

The water contact angles on the panels subjected to this additional two stage process were estimated as described above in example 1 with substantially similar results. While the invention has been described to some degree of particularity, various adaptations and modifications can be made without departing from the scope of the invention as defined in the appended claims.

What is claimed is:

1. A method of controlling the spread of an adhesive on an organic substrate having a circuitized surface, said method comprising:
    exposing the organic substrate to a plasma comprising a fluorine containing entity for a time sufficient to decrease the wettability of said circuitized surface to the adhesive.

2. The method of claim 1 wherein the amount of said fluorine containing entity is at least 20% by volume of said plasma.

3. The method of claim 1 wherein the amount of said fluorine containing entity is at least 40% by volume of the plasma.

4. The method of claim 3 wherein the plasma further comprises up to about 60% by volume of oxygen.

5. The method of claim 1 wherein the amount of said fluorine containing entity is from about 65% to about 85% by volume of the plasma.

6. The method of claim 5 wherein the plasma further comprises from about 15% to about 35% by volume of oxygen.

7. The method of claim 1 wherein the fluorine-containing entity is selected from the group consisting of $CF_4$, $SF_6$, and $C_2F_6$.

8. The method of claim 1 wherein the organic substrate is a semiconductor chip and wherein the amount of the fluorine containing entity is at least 40% by volume of the plasma.

9. The method of claim 1 wherein the plasma gas mixture comprises up to about 60% by volume of oxygen.

10. The method of claim 1 further comprising the following steps:
    (a) exposing the fluorine plasma-treated substrate to a plasma comprising argon; and
    (b) then exposing the argon plasma-treated substrate to a plasma comprising a fluorine-containing entity for a time sufficient to decrease the wettability of said circuitized surface.

11. The method of claim 1 wherein the organic substrate comprises an epoxy-based polymer.

12. The method of claim 1 wherein the organic substrate comprises a polyimide.

13. The method of claim 1 wherein the organic substrate is exposed to a plasma comprising a fluorine containing entity for a time sufficient to deposit a fluorocarbon film on the circuitry disposed on the surface of the substrate and to decrease the wettability of said circuitry.

14. A method of reducing the spread of an adhesive deposited on a surface of a circuitized organic substrate, said method comprising the following steps:

(a) providing an organic substrate comprising circuitry on a surface of said substrate;

(b) exposing said substrate to a first plasma comprising a gas selected from the group consisting of oxygen, argon, or mixtures thereof, wherein said substrate is exposed to said first plasma for a time sufficient to remove organic contaminants from said circuitry;

(c) then exposing said substrate to a second plasma comprising fluorine and oxygen for a time sufficient to decrease the wettability of the surface of the substrate;

wherein said exposure to said second plasma reduces the spread of an adhesive that is subsequently deposited onto the surface of the organic substrate.

15. The method of claim 14 wherein the substrate is exposed to said second plasma for about two minutes to about ten minutes at a gas pressure of from about 70 millitorr to about 400 millitorr.

16. The method of claim 15 wherein the amount of said fluorine containing entity is at least 40% by volume of the plasma of step (c).

17. The method of claim 16 wherein the plasma of step (c) further comprises up to about 60% by volume of oxygen.

18. The method of claim 15 wherein the amount of said fluorine containing entity is from about 65% to about 85% by volume of the plasma of step (c).

19. The method of claim 18 wherein the plasma of step (c) further comprises from about up from about 15% to about 35% by volume of oxygen.

* * * * *